United States Patent
Chiu et al.

(10) Patent No.: US 7,534,716 B2
(45) Date of Patent: May 19, 2009

(54) SYSTEM AND METHOD FOR VENTING PRESSURE FROM AN INTEGRATED CIRCUIT PACKAGE SEALED WITH A LID

(75) Inventors: Anthony M. Chiu, Richardson, TX (US); Tom Q. Lao, Murphy, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 30 days.

(21) Appl. No.: 11/517,879

(22) Filed: Sep. 8, 2006

(65) Prior Publication Data
US 2007/0001286 A1 Jan. 4, 2007

Related U.S. Application Data

(62) Division of application No. 10/405,529, filed on Apr. 2, 2003, now Pat. No. 7,126,210.

(51) Int. Cl.
H01L 21/44 (2006.01)
(52) U.S. Cl. .................................. 438/614; 438/124
(58) Field of Classification Search ............ 438/108, 438/118, 123, 124, 125, 126, 127, 612, 614, 438/617, 666; 257/E23.015, E23.02, E23.023, 257/E31.117, E31.118, E51.02
See application file for complete search history.

(56) References Cited

U.S. PATENT DOCUMENTS

| | | | |
|---|---|---|---|
| 5,409,865 A | 4/1995 | Karnezos | |
| 5,612,576 A | 3/1997 | Wilson et al. | |
| 5,642,261 A | 6/1997 | Bond et al. | |
| 5,663,106 A | 9/1997 | Karavakis et al. | |
| 5,721,450 A | 2/1998 | Miles | |
| 5,767,528 A | 6/1998 | Sumi et al. | |
| 5,842,275 A * | 12/1998 | McMillan et al. | ............. 29/840 |
| 5,843,808 A | 12/1998 | Karnezos | |
| 5,900,669 A * | 5/1999 | Knapp et al. | ................. 257/701 |
| 5,991,156 A | 11/1999 | Bond et al. | |
| 6,014,318 A | 1/2000 | Takeda | |
| 6,038,137 A | 3/2000 | Bhatt et al. | |

(Continued)

FOREIGN PATENT DOCUMENTS

EP 0 623 956 A2 11/1994

(Continued)

Primary Examiner—A. Sefer
Assistant Examiner—Dilinh P Nguyen
(74) Attorney, Agent, or Firm—Lisa K. Jorgenson; William A. Munck

(57) ABSTRACT

A system and method is disclosed for venting pressure from an integrated circuit package that is sealed with a lid. During a surface mount process for mounting a ball grid array integrated circuit package to a circuit board the application of heat (1) weakens the solder that seals a soldered lid, and (2) increases vapor pressure within the integrated circuit package. This may cause the soldered lid to move out of its soldered position. The present invention solves this problem by providing an integrated circuit with a solder mask that has a plurality of solder mask vents that form a plurality of vapor pressure vents through the solder. The vapor pressure vents prevent the occurrence of any increase in vapor pressure that would shift the soldered lid out of its soldered position. An alternate embodiment vents pressure through an epoxy layer that is used to attach a lid by epoxy.

20 Claims, 5 Drawing Sheets

U.S. PATENT DOCUMENTS

| | | | |
|---|---|---|---|
| 6,054,755 A | 4/2000 | Takamichi et al. |
| 6,278,613 B1 | 8/2001 | Fernandez et al. |
| 6,309,575 B1 | 10/2001 | Boutin et al. |
| 6,338,985 B1 | 1/2002 | Greenwood |
| 6,396,136 B2 | 5/2002 | Kalidas et al. |
| 6,410,981 B2 | 6/2002 | Tao |
| 6,424,033 B1 | 7/2002 | Akram |
| 6,551,862 B2 | 4/2003 | Oota et al. |
| 6,580,174 B2 | 6/2003 | McCormick et al. |
| 6,624,523 B2 | 9/2003 | Chao et al. |
| 6,634,099 B2 | 10/2003 | Rumsey |
| 6,678,167 B1 | 1/2004 | Degani et al. |
| 6,838,309 B1 | 1/2005 | McCann |
| 6,838,368 B1 | 1/2005 | Ohsawa et al. |
| 2002/0009826 A1 | 1/2002 | Chien |
| 2002/0079562 A1 | 6/2002 | Zhao et al. |
| 2002/0093091 A1 | 7/2002 | Huang et al. |
| 2002/0109226 A1 | 8/2002 | Khan et al. |

FOREIGN PATENT DOCUMENTS

| | | |
|---|---|---|
| EP | 1 003 214 A2 | 5/2000 |

\* cited by examiner

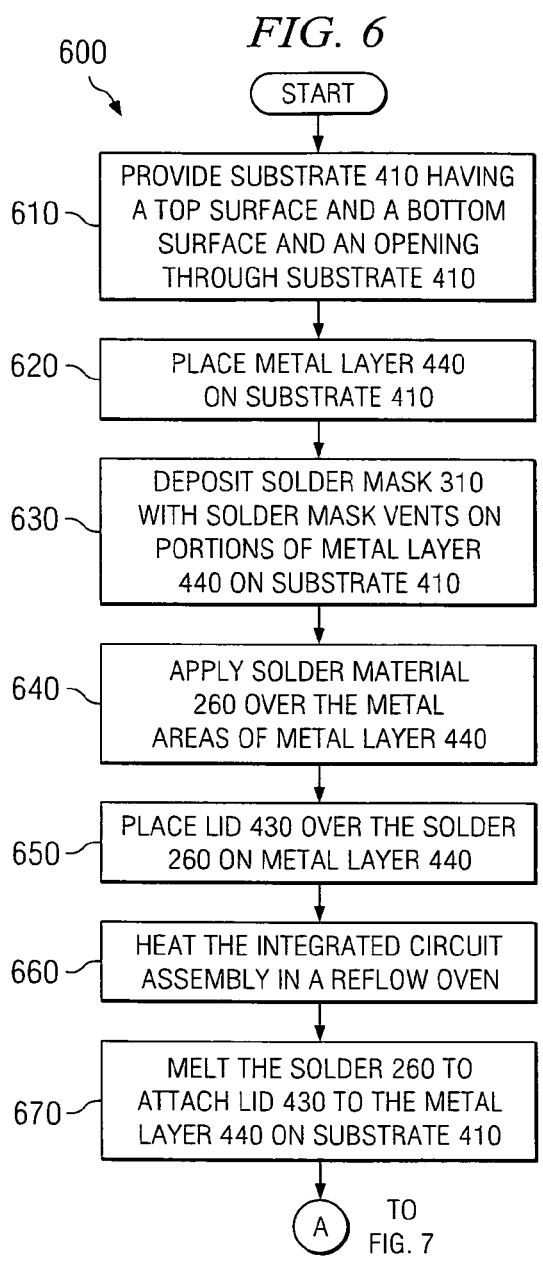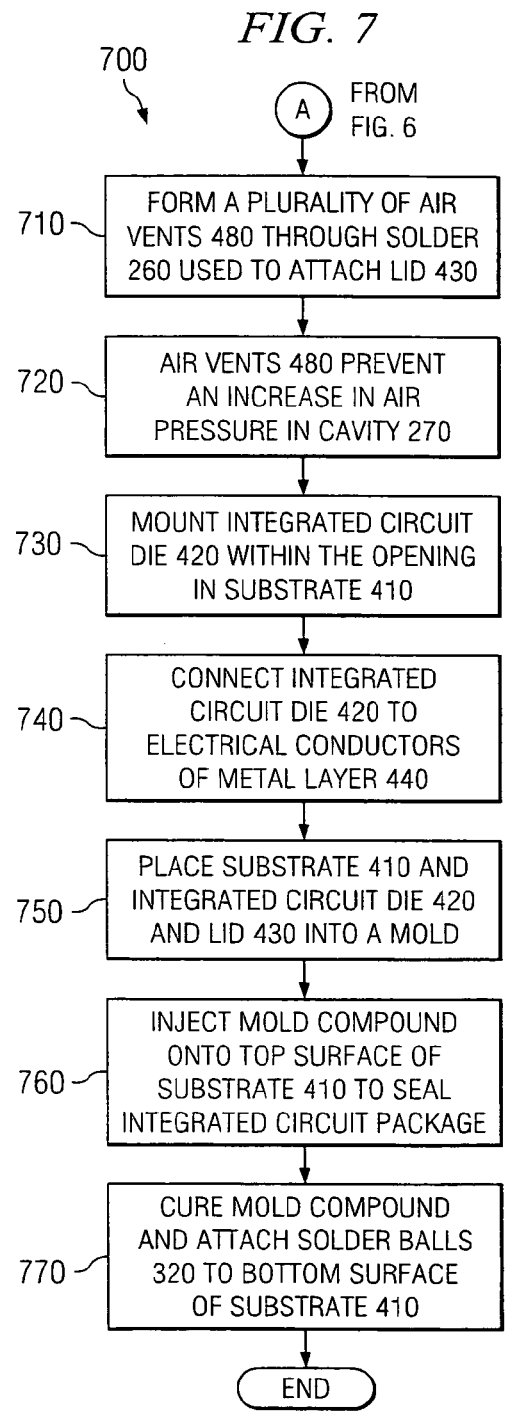

SYSTEM AND METHOD FOR VENTING PRESSURE FROM AN INTEGRATED CIRCUIT PACKAGE SEALED WITH A LID

This application is a divisional of prior U.S. patent application Ser. No. 10/405,529 filed on Apr. 2, 2003 now U.S. Pat. No. 7,126,210.

TECHNICAL FIELD OF THE INVENTION

The present invention is directed, in general, to integrated circuits and, more specifically, to a system and method for venting pressure from an integrated circuit package that is sealed with a lid.

BACKGROUND OF THE INVENTION

It is well known that the operation of an integrated circuit generates heat. In many applications an appreciable amount of heat may be generated by the operation of an integrated circuit. In some instances the heat from the operation of an integrated circuit may be dissipated into the surrounding ambient atmosphere through convection. In other instances the amount of heat to be removed that is generated by an integrated circuit may require the use of an external cooling mechanism. An example of an external cooling mechanism is a fan that blows cooling air over an integrated circuit to carry away heat.

In some instances the amount of heat that is generated by an integrated circuit may require a relatively large amount of cooling in order to dissipate the generated heat. For example, a sustained operation of an integrated circuit in a high power application may require an increased level of cooling in order for the integrated circuit to function properly. There is therefore a need for an efficient heat removal process to cool an integrated circuit while the integrated circuit is operating.

Integrated circuit packages exist that remove heat from an integrated circuit die by conducting heat from the integrated circuit die into a thermally conductive slug. The heat absorbed in the thermally conductive slug is ultimately transferred to the ambient atmosphere or to some external heat sink. The thermally conductive slug may be formed from a thermally conductive metal such as copper.

For example, U.S. Pat. No. 5,642,261 to Bond et al. discloses an integrated circuit having a substrate in which an opening has been formed to receive a thermally conductive slug. The integrated circuit die is mounted on one side of the slug and the underside of the slug is exposed at the underside of the substrate. The integrated circuit die is wire bonded to the substrate and encapsulated in a conventional manner. Solder balls are attached to the underside of the substrate and of the slug in a ball grid array fashion for mounting on a circuit board. When the integrated circuit package is mounted on a circuit board, a path of high thermal conductivity is provided between the integrated circuit die and the circuit board through the slug and the solder balls.

In another example, U.S. Pat. No. 5,693,572 to Bond et al. discloses a method for mounting an integrated circuit die within an integrated circuit package in which the integrated circuit die is mounted on a thermally conductive slug. The slug is attached to an underside portion of a substrate through which an opening has been formed to receive the slug. The integrated circuit die is wire bonded to the substrate and encapsulated in a conventional manner. Solder balls are attached to the underside of the substrate in a ball grid array fashion for mounting on a circuit board. When the integrated circuit package is mounted on a circuit board, a path of high thermal conductivity is provided between the integrated circuit die and the circuit board through the slug. The circuit board serves as a heat sink.

In an alternate embodiment of the invention disclosed in U.S. Pat. No. 5,693,572 to Bond et al. the integrated circuit die is placed within the opening that is formed in the substrate and the slug is located below the plane of the underside of the substrate. The slug may be epoxied or otherwise securely fastened to lateral surfaces of the underside of the substrate. Such integrated circuit packages are also the subject of U.S. Pat. No. 5,991,156 to Bond et al. Experience has shown that a very efficient method for attaching a thermally conductive slug of the type described above is a solder reflow process.

Semiconductor devices that are packaged in a ball grid array (BGA) package are usually mounted onto a circuit board using a surface mount process. During a surface mount process the temperature may exceed two hundred twenty degrees Celsius (220° C.). At this temperature the strength of a solder connection is reduced to zero for a solder alloy having a melting temperature that is less than two hundred twenty degrees Celsius (220° C.). It is possible to use a solder alloy that has a higher melting temperature but the use of such a solder alloy may cause irreversible damage to the substrate material.

Assume that a solder reflow process has been used to attach a thermally conductive slug to an integrated circuit die in a ball grid array package in the manner previously described in the prior art. During the surface mount process for mounting the ball grid array package to a circuit board, the high temperature causes the solder seal of the thermally conductive slug to be weakened. The expansion of moisture diffused into a cavity of the integrated circuit package causes an increase in vapor pressure within the cavity. The increased vapor pressure then causes the thermally conductive slug to shift or move out of its original position. Alternatively, the increased vapor pressure causes melted solder to ooze out from around the thermally conductive slug. The soldered thermally conductive slug may generally be referred to as a soldered lid.

There is therefore a need in the art for an efficient system for venting pressure from an integrated circuit package that is sealed with a soldered lid. Specifically, there is a need in the art for a system and method that is capable of providing a passage for moisture or vapor inside a cavity within a ball grid array integrated circuit package to escape from the cavity and reduce internal vapor pressure within the cavity.

Conductive epoxy can be used instead of solder to attach a lid to an integrated circuit die and substrate. However, if a continuous patch of epoxy material is applied the epoxy will stick to the integrated circuit die, the substrate and the solder mask, and will seal the cavity within the integrated circuit package. When this happens, an increase in vapor pressure caused by heating can cause an epoxied lid to move out of its position in the same manner as that previously described for a soldered lid. The term "epoxied lid" refers to a lid that is glued to another material using epoxy.

Therefore, there is also a need in the art for an efficient system and method for venting pressure from an integrated circuit package that is sealed with an epoxied lid.

SUMMARY OF THE INVENTION

To address the above-discussed deficiencies of the prior art, it is a primary object of the present invention to provide a system and method for venting pressure from an integrated circuit package that is sealed with a lid using solder or epoxy as a sealing material.

In an advantageous embodiment of the invention for venting pressure from an integrated circuit package that is sealed with a soldered lid, the invention comprises an integrated circuit comprising a substrate having a top surface and a bottom surface, and having portions that form an opening through the substrate, and at least one metal layer on the substrate having portions that form a plurality of electrical conductors and an integrated circuit die mounted within the opening through the substrate and electrically connected to the plurality of electrical conductors of the at least one metal layer, and a solder mask deposited over portions of the at least one metal layer on the bottom surface of the substrate. The solder mask is formed having a plurality of solder mask vents that form a plurality of metal layer portions of the at least one metal layer around the opening on the bottom surface of the substrate.

The integrated circuit also comprises a lid having a top surface and a bottom surface. The lid is capable of covering the opening through the substrate when the lid is placed adjacent to the opening. The lid is capable of being soldered to cover the opening by being soldered to the plurality of metal layer portions of the at least one metal layer around the opening on the bottom surface of the substrate. The plurality of solder mask vents form a plurality of vapor pressure vents through the solder material that is used to solder the lid to the plurality of metal layer portions. The vapor pressure vents prevent the occurrence of any increase in vapor pressure in the integrated circuit that would shift the soldered lid out of its soldered position.

An alternate advantageous embodiment of the invention is provided for venting pressure from an integrated circuit package that is sealed with an epoxied lid.

It is an object of the present invention to provide an integrated circuit having a soldered lid in which the soldered lid does not move out of its soldered position when heat is applied.

It is also an object of the present invention to provide an integrated circuit with a soldered lid in which melted solder does not flow around the soldered lid when heat is applied.

It is yet another object of the present invention to provide an integrated circuit having a solder mask that provides solder mask vents that form vapor pressure vents through solder material that is used to solder a soldered lid to the integrated circuit.

It is another object of the present invention to provide a method for manufacturing an integrated circuit that is sealed with a soldered lid that is capable of venting pressure from the integrated circuit when heat is applied to the integrated circuit during a surface mount process.

It is also an object of the present invention to provide an integrated circuit having an epoxied lid in which the epoxied lid does not move out of its epoxied position when heat is applied.

It is also an object of the present invention to provide an integrated circuit with an epoxied lid in which melted epoxy does not flow around the epoxied lid when heat is applied.

It is yet another object of the present invention to provide an integrated circuit having vapor pressure vents through epoxy material that is used to epoxy an epoxied lid to the integrated circuit.

It is another object of the present invention to provide a method for manufacturing an integrated circuit that is sealed with an epoxied lid that is capable of venting pressure from the integrated circuit when heat is applied to the integrated circuit during a surface mount process.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. In particular, a controller may comprise a data processor and an associated memory that stores instructions that may be executed by the data processor. It should be noted that the functionality associated with any particular controller might be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which:

FIG. 6 illustrates a flow chart that shows an operation of an advantageous embodiment of a first portion of a method of the present invention for manufacturing an integrated circuit having a soldered lid;

FIG. 7 illustrates a flow chart that shows an operation of an advantageous embodiment of a second portion of a method of the present invention for manufacturing an integrated circuit having a soldered lid;

DETAILED DESCRIPTION OF THE INVENTION

FIGS. 1 to 10, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit package.

Figure 1:
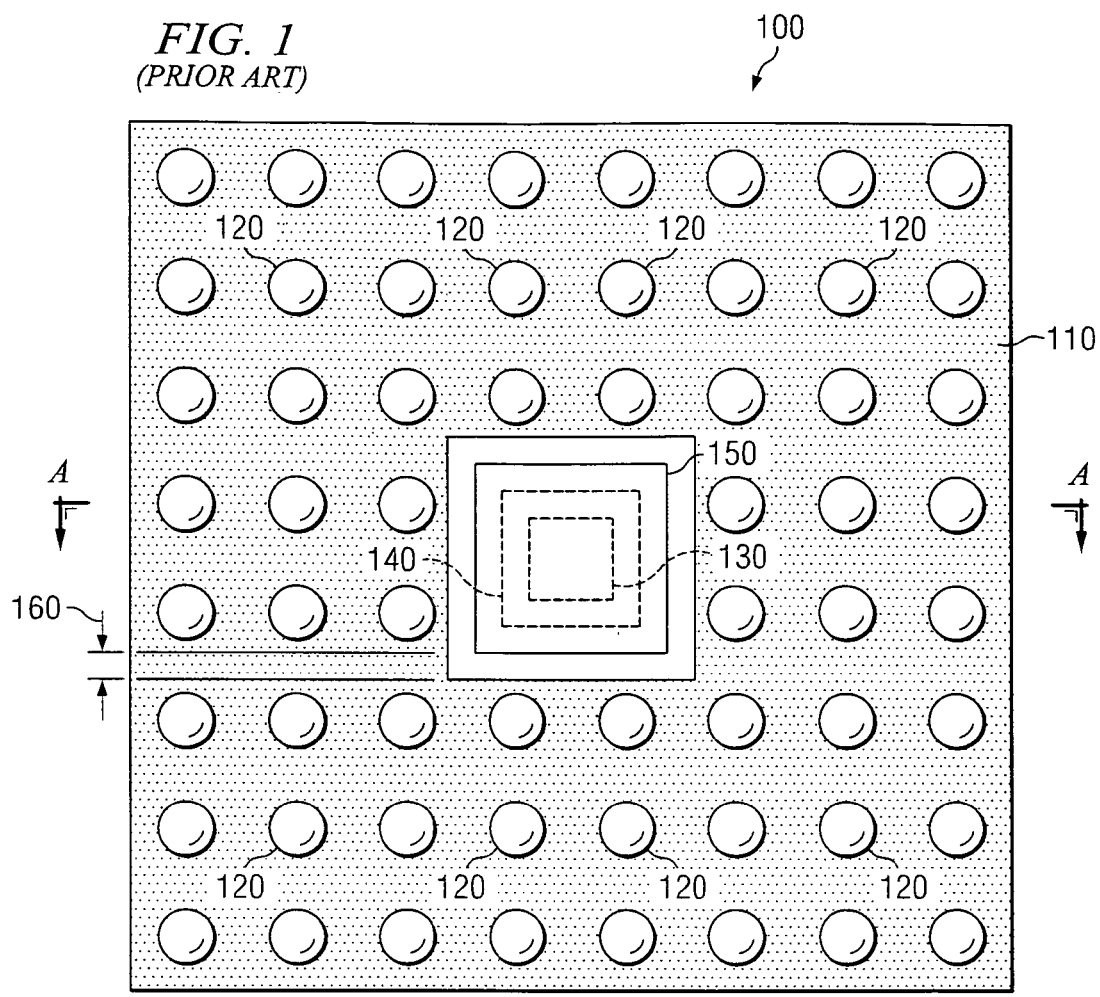
FIG. 1 illustrates a bottom plan view of a prior art ball grid array integrated circuit package in which a solder mask is indicated by a shaded portion and in which a placement of an integrated circuit die is shown and in which a placement of a soldered lid is shown.
Figure 2:
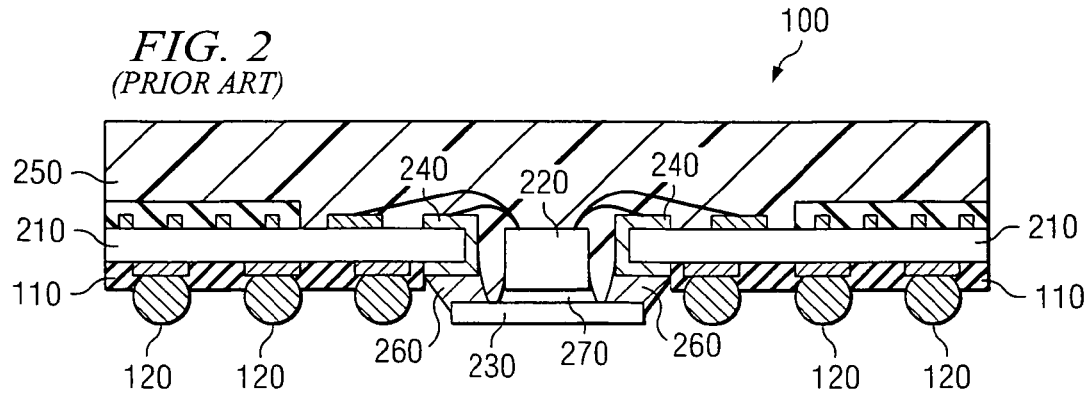
FIG. 2 illustrates a cross sectional view of the prior art ball grid array integrated circuit package shown in FIG. 1 taken along line A-A.

FIG. 1 illustrates a bottom plan view of an exemplary prior art ball grid array (BGA) integrated circuit package 100. Integrated circuit package 100 comprises solder mask 110. The shaded portion of FIG. 1 represents solder mask 110. Each of the plurality of circles shown in FIG. 1 represents a conventional solder ball 120. FIG. 2 illustrates a cross sectional view of the prior art ball grid array (BGA) integrated circuit package 100 shown in FIG. 1 taken along line A-A.

By referring to FIG. 1 and to FIG. 2 it may be seen that integrated circuit package 100 comprises a substrate 210 having portions that form a square opening within the substrate 210 in the center of the integrated circuit package 100. The present invention is not limited to the use of a square opening. In other embodiments the opening may have other geometrical forms (e.g., a rectangle). An integrated circuit die 220 having a square shape is located within the square opening in substrate 210. A lid 230 is placed over integrated circuit die 220 and is soldered into position over integrated circuit die 220 using a solder reflow process. Integrated circuit die 220 is wire bonded to metal layers 240 on substrate 210 and encapsulated in a conventional manner with mold compound 250.

FIG. 1 illustrates the location of the placement of integrated circuit die 220 in the center of integrated circuit package 100. Integrated circuit die 220 is located within the dashed outline of square 130. Proceeding outwardly from the dashed outline of square 130, the dashed outline of square 140 represents the boundary of the square opening within substrate 210. FIG. 1 also illustrates the location of the placement of lid 230 over integrated circuit die 220. The solid outline of square 150 represents the boundary of lid 230. The portion 160 between the solid outline of square 150 and the interior edge of solder mask 110 represents the location of metal layer 240 on substrate 210 near the edge of the opening in substrate 210.

As shown in FIG. 2, mold compound 250 extends through the opening in substrate 210 and covers the sides of integrated circuit die 220. Lid 230 is soldered to metal layer 240 with solder 260. If the upper surface of lid 230 is not in contact with the lower surface of integrated circuit die 220 then a cavity 270 is formed between lid 230 and integrated circuit die 220.

As previously discussed, during the surface mount process for mounting the ball grid array (BGA) integrated circuit package 100 to a circuit board the high temperature weakens solder 260 that fastens lid 230 to metal layers 240. The expansion of moisture diffused into cavity 270 causes an increase in vapor pressure within cavity 270. The increased vapor pressure may then cause lid 230 to shift or move out of its original position. Alternatively, the increased vapor pressure may cause melted solder 260 to ooze out from around lid 230.

As will be more fully discussed, the present invention solves this problem by providing a ball grid array (BGA) integrated circuit package with solder mask vents for venting pressure that may build up within the integrated circuit package.

Figure 3:
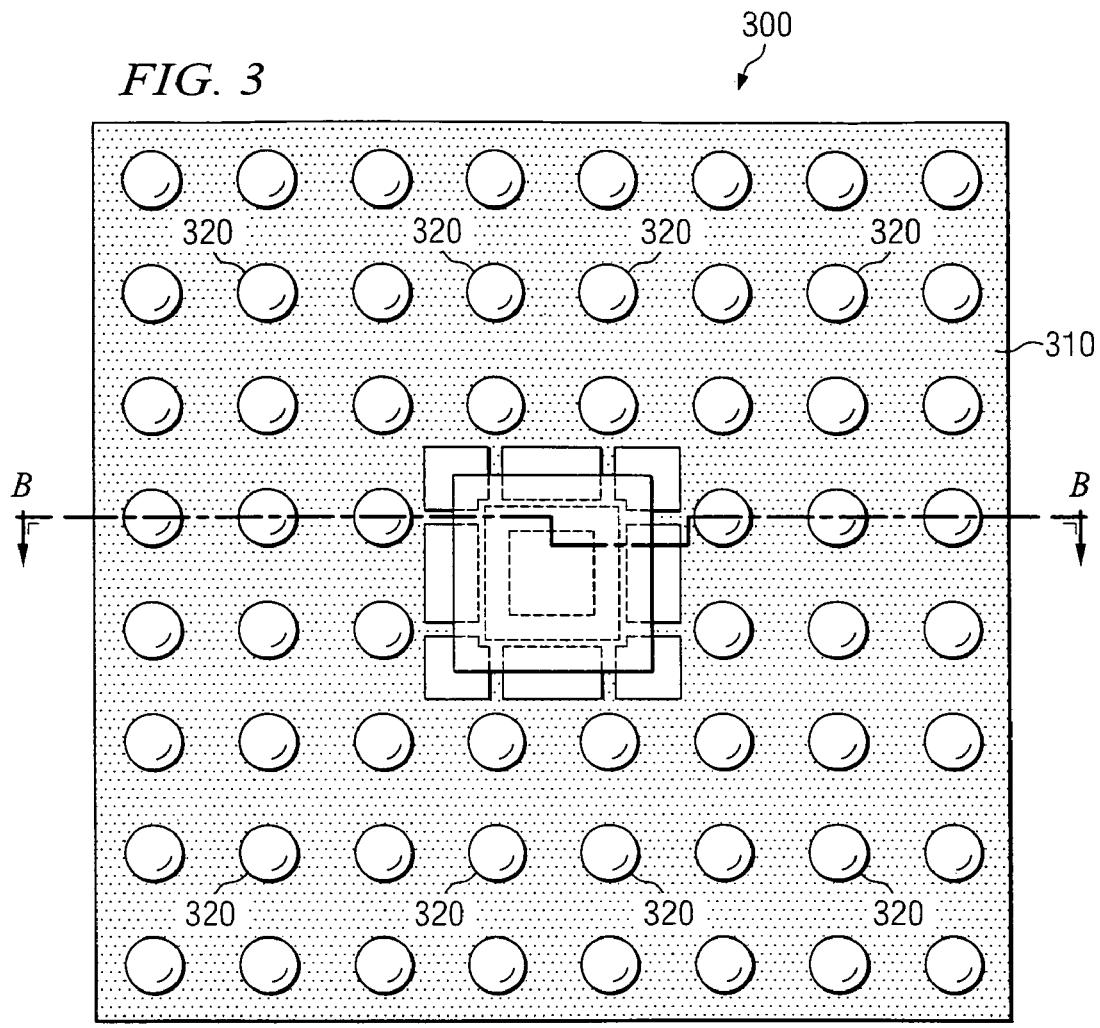
FIG. 3 illustrates a bottom plan view of a ball grid array integrated circuit package in accordance with the principles of the present invention in which a solder mask having solder mask vents is indicated by a shaded portion and in which a placement of an integrated circuit die is shown and in which a placement of a soldered lid is shown.
Figure 4:
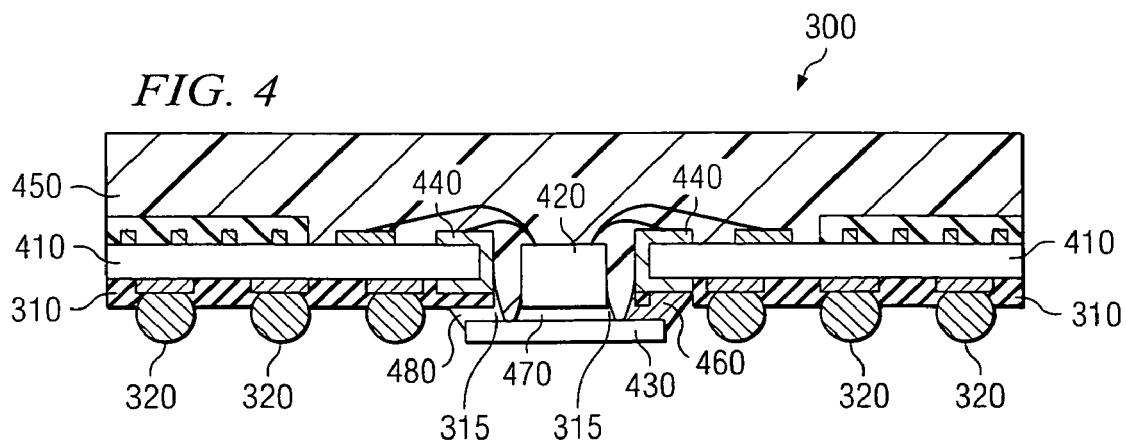
FIG. 4 illustrates a cross sectional view of the ball grid array integrated circuit package shown in FIG. 3 taken along line B-B.

FIG. 3 illustrates a bottom plan view of an exemplary ball grid array (BGA) integrated circuit package 300 in accordance with the principles of the present invention. Integrated circuit package 300 comprises solder mask 310. The shaded portion of FIG. 3 represents solder mask 310. Each of the plurality of circles shown in FIG. 3 represents a conventional solder ball 320. FIG. 4 illustrates a cross sectional view of the ball grid array (BGA) integrated circuit package 300 shown in FIG. 3 taken along line B-B. As will be more fully discussed, solder mask 310 is formed having solder mask vents 315.

By referring to FIG. 3 and to FIG. 4 it may be seen that integrated circuit package 300 comprises a substrate 410 having portions that form a square opening within the substrate 410 in the center of the integrated circuit package 300. The present invention is not limited to the use of a square opening. In other embodiments the opening may have other geometrical forms (e.g., a rectangle). An integrated circuit die 420 having a square shape is located within the square opening in substrate 410. A lid 430 is placed over integrated circuit die 420 and is soldered into position over integrated circuit die 420 using a solder reflow process. Integrated circuit die 420 is wire bonded to metal layers 440 on substrate 410 and encapsulated in a conventional manner with mold compound 450.

Figure 5:
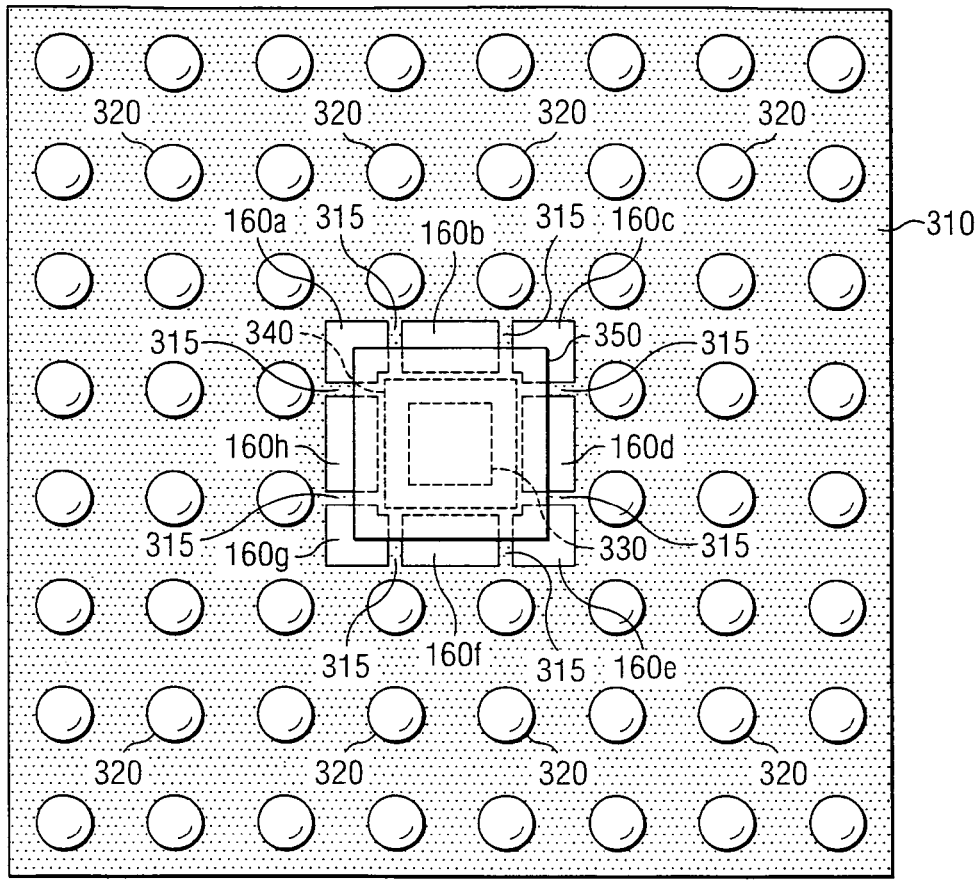
FIG. 5 illustrates a more detailed view of the central portion of the bottom plan view of the ball grid array integrated circuit package shown in FIG. 3.

FIG. 5 illustrates a more detailed view of the central portion of the bottom plan view of the ball grid array (BFA) integrated circuit package 300 shown in FIG. 3. FIG. 5 illustrates the location of the placement of integrated circuit die 420 in the center of integrated circuit package 300. Integrated circuit die 420 is located within the dashed outline of square 330. Proceeding outwardly from the dashed outline of square 330, the solid outline of square 340 represents the boundary of the square opening within substrate 410. As shown in FIGS. 3, 4 and 5 solder mask 310 extends up to the boundary 340 of the square opening within substrate 410.

FIG. 5 also illustrates the location of the placement of lid 430 over integrated circuit die 420. The solid outline of square 350 represents the boundary of lid 430. The portions (160a, 160b, 160c, 160d, 160e, 160f, 160g, 160h) under the solid outline of square 350 represent the location of metal layer 440 on substrate 410 near the edge of the opening in substrate 410. Solder mask 310 is formed having a plurality of solder mask vents 315 that separate metal layer 440 into separate portions 160. In the embodiment shown in FIGS. 3, 4 and 5 there are eight (8) portions (160a-160h) of metal layer 440. The number eight is chosen as an example. In other embodiments metal layer 440 may be separated into some other number of portions.

As shown in FIG. 4, mold compound 450 extends through the opening in substrate 410 and covers the sides of integrated circuit die 420. Lid 430 is soldered to metal layer 440 with solder 460. If the upper surface of lid 430 is not in contact with the lower surface of integrated circuit die 420 then a cavity 470 is formed between lid 430 and integrated circuit die 420. Unlike lid 230 in prior art integrated circuit package 100, lid 430 is not soldered to metal layer 440 in a manner that causes solder 460 to completely seal off cavity 470. The solder mask vents 315 of solder mask 310 provide a plurality of vapor pressure vents 480 through solder 460. The presence of a plurality of vapor pressure vents 480 through solder 460 prevent vapor pressure from building up in cavity 470 when integrated circuit package 300 is subjected to high temperature. The venting of vapor pressure insures that lid 430 is not moved out of its proper position during a surface mount process.

FIG. 6 illustrates a flow chart that shows an operation of an advantageous embodiment of a first portion of a method of the present invention for manufacturing an integrated circuit having a soldered lid. The steps of the first portion of the method shown in FIG. 6 are collectively referred to with reference numeral 600.

In the first step a substrate 410 of integrated circuit 300 is provided. Substrate 410 has a top surface and a bottom surface. Substrate 410 also has portions that form an opening through substrate 410. (Step 610). Then at least one metal layer 440 is placed on substrate 410. Metal layer 440 has portions that form a plurality of electrical conductors. (Step 620). A solder mask 310 is then deposited over portions of metal layer 440 on the bottom surface of substrate 410. Solder mask 310 is formed having a plurality of solder mask vents that form a plurality of metal layer portions 160 of metal layer 440 around the opening on the bottom surface of substrate 410. (Step 630).

Solder material 260 is then applied over the metal areas of metal layer 440. (Step 640). A lid 430 is then provided that is large enough to cover the opening through substrate 410 when lid 430 is placed adjacent to the opening through substrate 410. Lid 430 has a top surface and a bottom surface. Lid 430 is placed over the solder material 260 on metal layer 440. (Step 650). The integrated circuit assembly is then heated in a reflow oven. (Step 660). The heat from the reflow oven melts the solder material 260 to attach lid 430 to the plurality of metal layer portions 160 of metal layer 440 around the opening on the bottom surface of substrate 410. (Step 670).

FIG. 7 illustrates a flow chart that shows an operation of an advantageous embodiment of a second portion of a method of the present invention for manufacturing an integrated circuit having a soldered lid. The steps of the second portion of the method shown in FIG. 7 are collectively referred to with reference numeral 700. Step 710 of FIG. 7 follows step 670 of FIG. 6.

The solder mask vents form a plurality of vapor pressure vents 480 through the solder 260 that is used to solder lid 430 to the plurality of metal layer portions 160. (Step 710). The vapor pressure vents 480 through the solder 260 prevent an increase in vapor pressure from occurring in cavity 270 between lid 430 and integrated circuit die 420. (Step 720). There is therefore no increase in vapor pressure in cavity 270 that would (1) shift lid 430 out of its desired soldered position when solder 260 is heated, or (2) cause melted solder 260 to flow around lid 430 when solder 260 is heated.

Integrated circuit die 420 is then mounted within the opening through substrate 410. (Step 730). Integrated circuit die 420 is then electrically connected to the plurality of electrical conductors of metal layer 440. (Step 740). The integrated circuit assembly (comprising substrate 410, integrated circuit die 420, and soldered lid 430) is then placed into a conventional mold (not shown). (Step 750). Mold compound is then injected onto the top surface of substrate 410 to seal integrated circuit 300 in a conventional integrated circuit package. (Step 760). Lastly, the mold compound is cured and a plurality of solder balls 320 is attached to the bottom surface of substrate 410. (Step 770).

As previously mentioned, conductive epoxy can be used instead of solder to attach a lid to an integrated circuit die and substrate. However, if a continuous patch of epoxy material is applied, the epoxy will stick to the integrated circuit die, the substrate and the solder mask, and will seal the cavity within the integrated circuit package. When this happens, an increase in vapor pressure caused by heating can cause an epoxied lid to move out of its position in the same manner as that previously described for an integrated circuit having a soldered lid.

An alternate advantageous embodiment of the invention is capable of venting pressure from an integrated circuit package that is sealed with an epoxied lid. In this embodiment of the invention epoxy is placed on selected portions of the substrate and on selected portions of the integrated circuit die. The placement of individual portions of epoxy creates one or more vapor pressure vents through the epoxy. The vapor pressure vents are capable of venting vapor pressure from an integrated circuit having an epoxied lid in the same manner as that previously described for an integrated circuit having a soldered lid.

Figure 8:
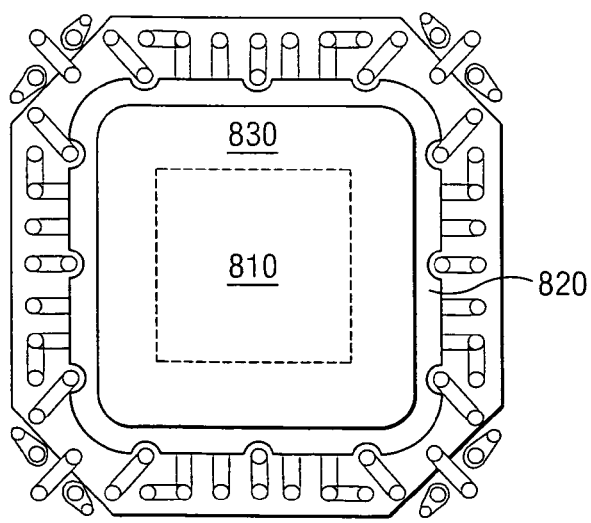
FIG. 8 illustrates a plan view of a prior art epoxy pattern placed on the surface of an integrated circuit die, substrate, and solder mask before the attachment of an epoxied lid.

FIG. 8 illustrates a plan view of a prior art epoxy pattern placed on the surface of an integrated circuit die, substrate, and solder mask before the attachment of an epoxied lid. The central square in FIG. 8 represents the location of an integrated circuit die 810. The darkly shaded peripheral portion shown in FIG. 8 represents the location of solder mask 820. The lightly shaded portion of FIG. 8 that fully covers integrated circuit die 810 and that extends to the location of solder mask 820 represents a prior art epoxy pattern 830.

Applying epoxy in accordance with prior art epoxy pattern 830 will cause the epoxy to fully cover the opening in the substrate in which integrated circuit die 810 is located. An epoxy lid (not shown in FIG. 8) is then set in position on the epoxy pattern and the epoxy is cured. The epoxy lid will then completely seal the bottom of integrated circuit die 810. As previously described, heating may cause an increase in vapor pressure within a cavity in the integrated circuit. This may cause the epoxy lid to move out of its position or the epoxy material to flow around the epoxy lid.

Figure 9:
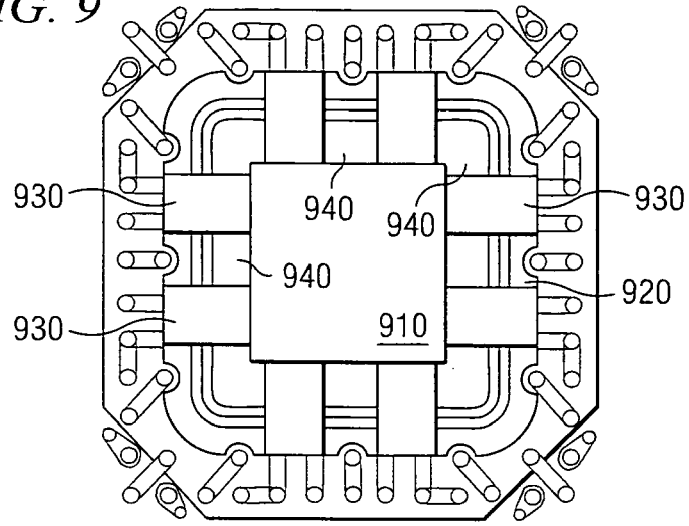
FIG. 9 illustrates a plan view of an epoxy venting pattern of the present invention placed on the surface of an integrated circuit die, substrate, and solder mask before the attachment of an epoxied lid.

FIG. 9 illustrates a plan view of an epoxy venting pattern of the present invention placed on the surface of an integrated circuit die, substrate, and solder mask before the attachment of an epoxied lid. The lightly shaded central square in FIG. 9 represents the location of an integrated circuit die 910. The darkly shaded peripheral portion shown in FIG. 9 represents the location of solder mask 920. The eight (8) lightly shaded portions of FIG. 9 that extend from solder mask 920 to integrated circuit die 910 represent a partial epoxy pattern 930. The eight (8) white portions between each of the eight (8) lightly shaded portions of partial epoxy pattern 930 represent a plurality of vapor pressure vents 940. Mold compound may extend into the plurality of vapor pressure vents 940.

Applying epoxy in accordance with epoxy pattern 930 will cause the epoxy to provide vapor pressure vents 940 so that the opening in the substrate in which integrated circuit die 910 is located will not be completely sealed off. An epoxy lid (not shown in FIG. 9) is then set in position on the epoxy pattern and the epoxy is cured. Vapor pressure vents 940 will prevent the epoxy lid from completely sealing off the bottom region of integrated circuit die 910 and mold compound. The epoxy pattern 930 of the present invention provides vapor pressure vents 940 to vent any increase in vapor pressure within a cavity of the integrated circuit.

Figure 10:
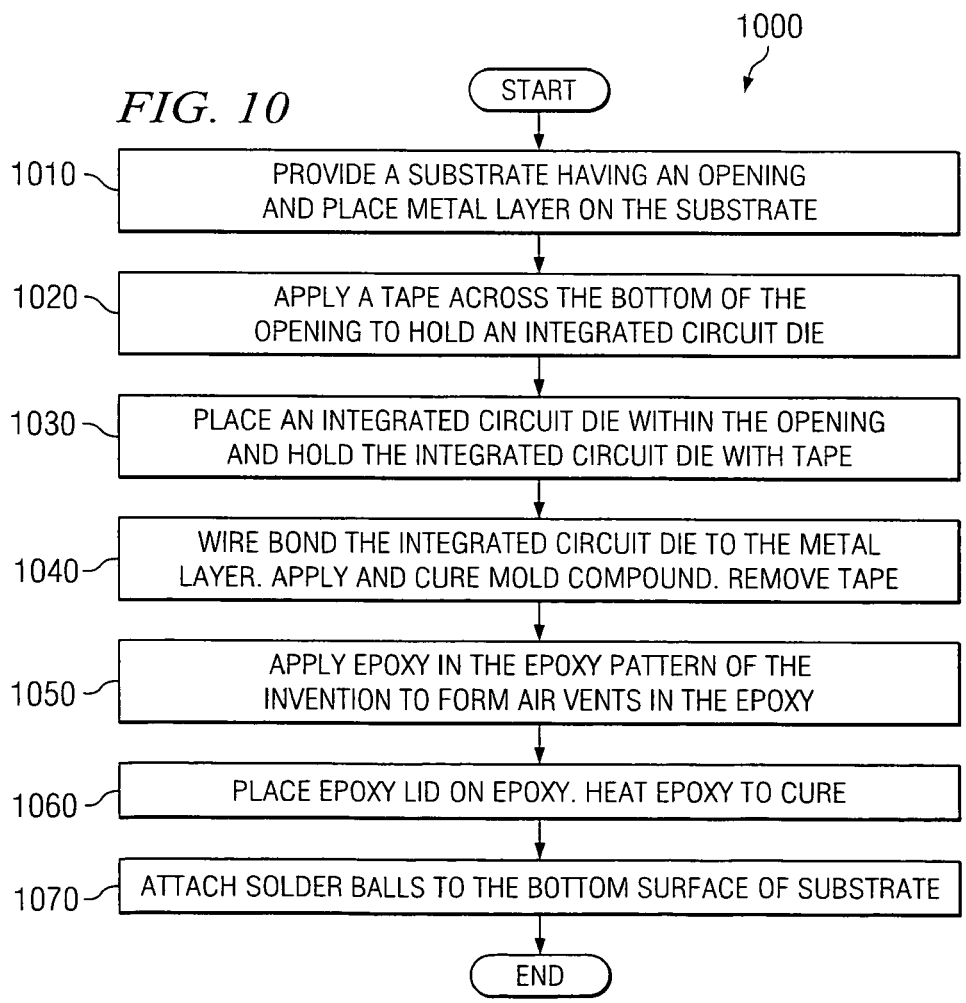
FIG. 10 illustrates a flow chart that shows an operation of an advantageous embodiment of a method of the present invention for manufacturing an integrated circuit having an epoxied lid.

FIG. 10 illustrates a flow chart that shows an operation of an advantageous embodiment of a method of the present invention for manufacturing an integrated circuit having an epoxied lid. The steps of the method shown in FIG. 10 are collectively referred to with reference numeral 1000.

The flow chart shown in FIG. 10 describes the method in general terms. In the first step a substrate for an integrated circuit is provided. The substrate has a top surface and a bottom surface. The substrate also has portions that form an opening through the substrate. Then at least one metal layer having electrical conductors is placed on the substrate. (Step 1010). A tape is then placed across the bottom surface of the opening in the substrate. The tape is capable of holding an integrated circuit die. (Step 1020).

An integrated circuit die (IC die) is then placed within the opening through the substrate and held in place by the tape. (Step 1030). Then the integrated circuit die is wire bonded to the metal layer. Mold compound is then applied to seal and protect the integrated circuit die within the integrated circuit. The mold compound is cured and hardened. Because the mold compound now holds the integrated circuit die is place within the opening in the substrate, the tape is now removed from the bottom of the substrate. (Step 1040).

Epoxy material is then applied to the bottom of the integrated circuit die. The epoxy material is applied in accordance with the epoxy pattern of the present invention in order form vapor pressure vents through the epoxy material. (Step 1050). An epoxy lid is then provided that is large enough to cover the opening through the substrate when the epoxy lid is placed adjacent to the opening through the substrate. The epoxy lid has a top surface and a bottom surface. When epoxy lid is in place, then the epoxy is heated in a reflow oven. The heat from the reflow oven melts and cures the epoxy to attach the epoxy lid to the bottom of the integrated circuit die. (Step 1060). Lastly, a plurality of solder balls is attached to the bottom surface of the substrate. (Step 1070).

Although the present invention has been described in detail, those skilled in the art should understand that they could make various changes, substitutions and alterations herein without departing from the spirit and scope of the invention in its broadest form.

What is claimed is:

1. A method of fabricating an integrated circuit, said method comprising the steps of:
    providing a substrate having a top surface and a bottom surface, and having portions that form an opening through said substrate;
    applying at least one metal layer to said substrate to form a plurality of electrical conductors;
    mounting an integrated circuit die within said opening through said substrate and electrically connecting said integrated circuit die to said plurality of electrical conductors of said at least one metal layer;
    depositing a solder mask over portions of said at least one metal layer to define a plurality of metal layer portions of said at least one metal layer around said opening on said bottom surface of said substrate, wherein said solder mask is formed defining a plurality of solder mask vents around said opening; and
    soldering, using solder material, a lid to said plurality of metal layer portions such that said plurality of solder mask vents form a plurality of vapor pressure vents through said solder material into a cavity between at least part of the integrated circuit die and said lid over said opening.

2. The method as claimed in claim 1 further comprising the step of:
    venting vapor pressure through said vapor pressure vents through said solder material to prevent an increase in vapor pressure from occurring in the cavity within said integrated circuit.

3. The method as claimed in claim 1 further comprising the step of:
    venting vapor pressure through said vapor pressure vents through said solder material to prevent the occurrence of a one of: a shift of said lid out of a desired soldered position when said solder material is heated and a flow of melted solder around said lid when said solder material is heated.

4. The method as claimed in claim 1 wherein said lid comprises a thermally conductive material.

5. The method as claimed in claim 1 wherein said lid comprises a metal.

6. The method as claimed in claim 1 further comprising the steps of:
    electrically connecting a plurality of solder balls with a plurality of electrical conductors of said substrate; and
    making a connection with said plurality of solder balls to a circuit board.

7. The method as claimed in claim 1 further comprising the step of:
    encapsulating with a mold compound said top surface of said substrate and said integrated circuit die within said opening of said substrate.

8. The method as claimed in claim 1 wherein a shape of said opening through said substrate is square and a shape of said integrated circuit die is square.

9. The method as claimed in claim 8 wherein said plurality of solder mask vents comprise at least one solder mask vent on each side of said square integrated circuit die.

10. A method of fabricating an integrated circuit, said method comprising the steps of:
    providing a substrate having a top surface and a bottom surface, and having portions that form an opening through said substrate;
    applying at least one metal layer to said substrate having portions that form a plurality of electrical conductors;
    mounting an integrated circuit die within said opening through said substrate and electrically connecting said integrated circuit die to said plurality of electrical conductors of said at least one metal layer; and
    depositing an epoxy layer over portions of said at least one metal layer wherein said epoxy layer is formed having a plurality of vapor pressure vents therethrough into a cavity between at least part of the integrated circuit die and a lid over said opening.

11. The method as claimed in claim 10 further comprising the steps of:
    providing said lid having a top surface and a bottom surface, wherein said lid is capable of covering said opening through said substrate when said lid is placed adjacent to said opening;
    attaching said lid by epoxy to cover said opening; and
    venting vapor pressure through said vapor pressure vents in said epoxy layer to prevent an increase in vapor pressure from occurring in the cavity within said integrated circuit.

12. The method as claimed in claim 11 further comprising the step of:

venting vapor pressure through said vapor pressure vents in said epoxy layer to prevent the occurrence of one of: an shift of said lid out of a desired epoxied position when said epoxy layer is heated and a flow of melted epoxy around said lid when said epoxy layer is heated.

13. The method as claimed in claim 11 wherein said lid comprises a thermally conductive material.

14. A method of fabricating an integrated circuit, said method comprising the steps of:
   providing a substrate having a top surface and a bottom surface, and having portions that form an opening through said substrate;
   forming a plurality of electrical conductors on said substrate;
   mounting an integrated circuit die within said opening through said substrate and electrically connecting said integrated circuit die to said plurality of electrical conductors; and
   depositing at least one material over at least one of at least a portion of said integrated circuit die and at least a portion of said substrate, for securing a lid over said opening, said at least one material having a plurality of pressure vents therethrough into a cavity between at least part of the integrated circuit die and said lid.

15. The method as claimed in claim 14 wherein said plurality of electrical conductors comprise a portion of at least one metal layer.

16. The method as claimed in claim 15 wherein said at least one material comprises a solder mask deposited over at least a portion of said at least one metal layer, said solder mask having a plurality of solder mask vents around said opening.

17. The method as claimed in claim 16 further comprising:
   covering said opening with the lid by soldering said lid to portions of said at least one metal layer around said opening.

18. The method as claimed in claim 17 wherein said solder mask vents result in said pressure vents through a solder material when the solder material is used to solder said lid to said portions of said at lest one metal layer.

19. The method as claimed in claim 18 wherein said pressure vents preventing an increase in vapor pressure in the hail cavity between the lid and the integrated circuit die during a surface mount process where the integrated circuit is mounted onto a circuit board.

20. The method as claimed in claim 14 wherein said at least one material comprises an epoxy.

* * * * *

UNITED STATES PATENT AND TRADEMARK OFFICE
CERTIFICATE OF CORRECTION

PATENT NO.         : 7,534,716 B2                                    Page 1 of 1
APPLICATION NO.    : 11/517879
DATED              : May 19, 2009
INVENTOR(S)        : Anthony M. Chiu and Tom Q. Lao It is certified that error appears in the above-identified patent and that said Letters Patent is hereby corrected as shown below:

Column 11, Claim 12, line 2, delete "an", insert -- a --; and

Column 12, Claim 19, line 17, delete "hail".

Signed and Sealed this

Fifth Day of October, 2010

David J. Kappos
*Director of the United States Patent and Trademark Office*